US012672511B2

(12) United States Patent
Umeoka

(10) Patent No.: US 12,672,511 B2
(45) Date of Patent: Jun. 30, 2026

(54) SEMICONDUCTOR PROCESSING APPARATUS WITH ENHANCED CHAMBER USABILITY AND THE METHOD THEREOF

(71) Applicant: ASM IP Holding B.V., Almere (NL)

(72) Inventor: Yoshiyuki Umeoka, Fuchu (JP)

(73) Assignee: ASM IP Holding B.V., Almere (NL)

( * ) Notice: Subject to any disclaimer, the term of this patent is extended or adjusted under 35 U.S.C. 154(b) by 293 days.

(21) Appl. No.: 18/397,549

(22) Filed: Dec. 27, 2023

(65) Prior Publication Data

US 2024/0222176 A1 Jul. 4, 2024

Related U.S. Application Data

(60) Provisional application No. 63/477,776, filed on Dec. 29, 2022.

(51) Int. Cl.
*H10P 72/30* (2026.01)
*H10P 72/00* (2026.01)
*H10P 72/50* (2026.01)
*H10P 72/76* (2026.01)

(52) U.S. Cl.
CPC ...... *H10P 72/3304* (2026.01); *H10P 72/0606* (2026.01); *H10P 72/50* (2026.01); *H10P 72/7602* (2026.01)

(58) Field of Classification Search
CPC .. H10P 72/3304; H10P 72/0606; H10P 72/50; H10P 72/7602
See application file for complete search history.

(56) References Cited

U.S. PATENT DOCUMENTS

| | | | | | |
|---|---|---|---|---|---|
| 4,483,654 | A | * | 11/1984 | Koch | H10P 72/50 |
| | | | | | 414/744.5 |
| 6,580,955 | B2 | * | 6/2003 | Lin | H10P 72/0454 |
| | | | | | 414/940 |
| 7,993,457 | B1 | * | 8/2011 | Krotov | C23C 16/45544 |
| | | | | | 156/345.31 |
| 10,566,223 | B2 | * | 2/2020 | Lawson | H10P 72/0612 |
| 2006/0141806 | A1 | * | 6/2006 | Waldfried | H10P 14/6538 |
| | | | | | 257/E21.259 |
| 2012/0266819 | A1 | * | 10/2012 | Sanchez | C23C 16/54 |
| | | | | | 118/729 |
| 2018/0105951 | A1 | * | 4/2018 | Kim | C30B 25/02 |

* cited by examiner

*Primary Examiner* — Ziaul Karim
(74) *Attorney, Agent, or Firm* — Banner & Witcoff, Ltd.

(57) ABSTRACT

A wafer processing apparatus comprises first and second loadlocks, a first wafer handling chamber comprising a first robot, pass-through chamber comprising upper and lower slots, a second wafer handling chamber comprising a second robot, and a scheduling unit configured to schedule movements of wafers by the first and second robots. The scheduling unit is configured to schedule the first robot to move wafers originated from the first loadlock from at least one intermediate chamber into at least one first upper slot and to move wafers originated from the second loadlock from the at least one intermediate chamber into at least one second upper slot and further configured to schedule the first robot to move a wafer originated from the first loadlock from the at least one intermediate chamber into one of the at least one second upper slot when each first upper slot us occupied by wafers.

6 Claims, 5 Drawing Sheets

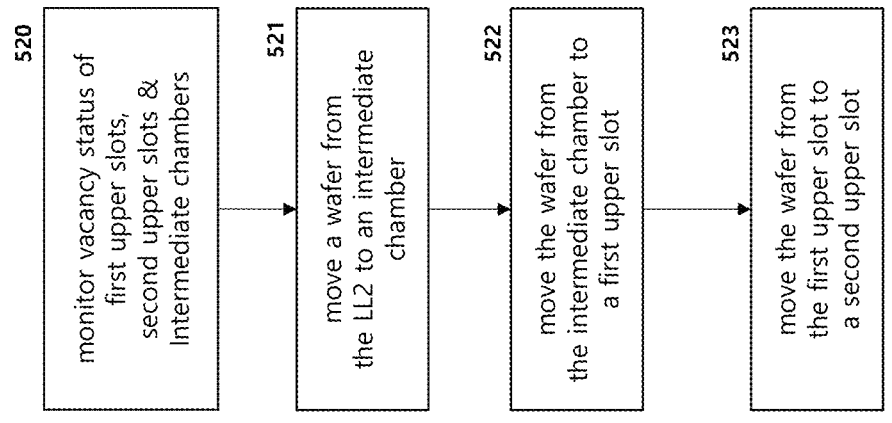

520 monitor vacancy status of first upper slots, second upper slots & Intermediate chambers

521 move a wafer from the LL2 to an intermediate chamber

522 move the wafer from the intermediate chamber to a first upper slot

523 move the wafer from the first upper slot to a second upper slot

Fig 5(b)

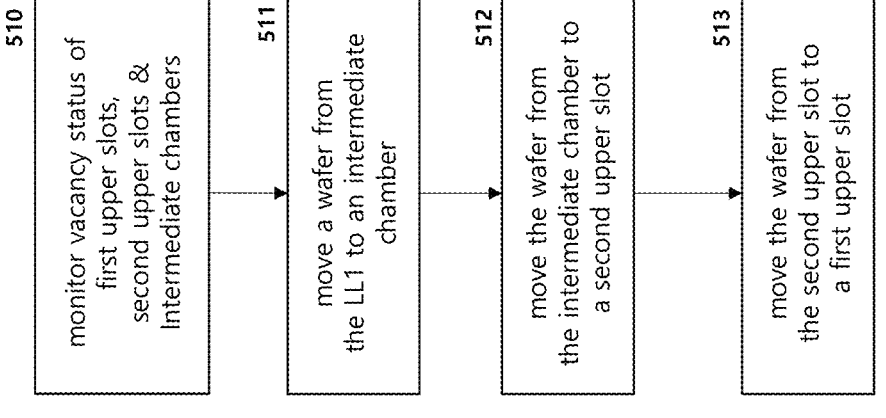

510 monitor vacancy status of first upper slots, second upper slots & Intermediate chambers

511 move a wafer from the LL1 to an intermediate chamber

512 move the wafer from the intermediate chamber to a second upper slot

513 move the wafer from the second upper slot to a first upper slot

Fig 5(a)

SEMICONDUCTOR PROCESSING APPARATUS WITH ENHANCED CHAMBER USABILITY AND THE METHOD THEREOF

CROSS-REFERENCE TO RELATED APPLICATION(S)

This application claims the benefit of U.S. Provisional Application 63/477,776 filed on Dec. 29, 2022, the entire contents of which are incorporated herein by reference.

FIELD OF INVENTION

The present disclosure relates to a substrate processing apparatus for processing a substrate, particularly to an apparatus with the ability to maximize the chamber usability for maximum substrate productivity.

BACKGROUND OF THE DISCLOSURE

In conventional substrate processing apparatuses, the wafers are aligned with alignment points from start to end of the process. The alignment of the wafers is important since not aligned wafers are difficult to handle and prone to fall when they are moving around the process modules.

FIGS. 1-3 illustrate a conventional substrate processing apparatus setup with four Process Modules (PM). The Equipment Front End Module (EFEM) 201 provides wafers to the apparatus. In the apparatus, loadlock 1 (231) and loadlock 2 (232) hold wafers and the loadlocks 1 and 2 are connected to the first wafer handling chamber 281 and the first robot 282 moves wafers between the loadlocks (231, 232) and the intermediate chambers (241, 242) and the pass-through chamber (261).

The pass-through chamber (PTC) comprises upper slots 262 for holding wafers moving from the at least one intermediate chamber and lower slots 263 for holding wafers moving from the at least one reaction chamber. The lower slots 263 are placed below the upper slots 262 and the upper slots 262 further comprising at least one first upper slot 234, 235 and at least one second upper slot 237, 238.

Also, a second wafer handling chamber 271 comprises a second robot 272 and the second robot 272 moves wafers between the reaction chambers (243, 244, 245, 246) and the PTC 261.

Seen from viewpoint A, the PTC is illustrated in detail in FIG. 2.

The PTC 261 comprises upper slots 262 and lower slots 263. The upper slots comprise first upper slots 234, 235 and second upper slots 237, 238. The lower slots 236, 239 are positioned lower than the upper slots 234, 235, 237, 238.

The first upper slots and the second upper slots are distinguished by their position, i.e., first upper slots 262-1 are positioned at left (seen from viewpoint A) and second upper slots 262-2 are positioned at right (also seen from viewpoint A).

The wafers are aligned in the EFEM 201. From the EFEM 201 a wafer 221 is aligned with an alignment point 211. It moves into loadlock 1 (231) and placed like a wafer 222 with an alignment point 212. The rotation of the alignment point is due to the movement of the wafer in the EFEM 201.

The wafer 222 is moving into an intermediate chamber by first robot 282 for waiting for the EPI process in one of the process modules (243, 244, 245, 246). Whether the wafer is placed in PM4 (242) or in PM3 (241), the alignment point (215) of the wafer 225 will be the same when in one of the first upper slot 262-1 in the PTC 261.

And this is the conventional method to move the wafers from loadlocks to EPI PMs. Because if a wafer 222 from the loadlock 1 is moved into a second upper slot (237 or 238), then the second robot 272 will move the wafer 000 into PM5 (243) and the alignment point 216-1 will not be placed aligned with the other wafers' alignment points (216).

Therefore, conventionally the wafers move from the loadlock 1 (331) into one of the intermediate chambers (341, 342) and then move into one of the first upper slots (262-1) and to one of the process modules (for example, 343) with alignment with the other wafers and this is illustrated in FIG. 3. An exemplary movement of a wafer from loadlock 1 (331) is illustrated in dotted arrows (E, F, G)

The same is true of the wafers from the loadlock 2 (332). That the wafers originated from loadlock 2 (332) move into one of the intermediate chambers (341, 342) and they should go into one of the second upper slots (262-2) and the one of the reaction chambers. FIG. 3 illustrates an exemplary path EE, FF and GG.

Due to this limitation (such that wafers from loadlock 1 should go to first upper slot and a wafer from loadlock 2 should go to second upper slot for keeping the alignment) and wafer's stay time in any one of the intermediate chambers is quite short, the wafers from the loadlock 1 should stay longer for its time into one of the first upper slots even though second upper slots have vacancies and vice versa.

The present disclosure is proposed to alleviate this bottleneck problem and to raise the chamber usability and productivity.

SUMMARY OF THE DISCLOSURE

This summary is provided to introduce a selection of concepts in a simplified form. These concepts are described in further detail in the detailed description of example embodiments of the disclosure below.

This summary is not intended to identify key features or essential features of the claimed subject matter, nor is it intended to be used to limit the scope of the claimed subject matter.

In accordance with an embodiment there may be provided, a wafer processing apparatus, comprising: a first loadlock and a second loadlock, the first and second loadlocks being configured to store a plurality of wafers and the wafers can be inserted into the first and second loadlocks and the wafers can be removed from the first and second loadlocks; at least one reaction chamber configured to process wafers; at least one intermediate chamber configured to hold wafers; a first wafer handling chamber configured to be connected to the first loadlock and the second loadlock and the at least one intermediate chamber, the first wafer handling chamber comprising a first robot, the first robot configured to move wafers between the first and second loadlocks, at least one intermediate chamber, and pass-through chamber; a pass-through chamber configured to be connected to the first wafer handling chamber, the pass-through chamber comprising upper slots for holding wafers from the at least one intermediate chamber, and lower slots for holding wafers from at least one reaction chamber and the lower slots are placed below the upper slots, and the upper slots further comprising at least one first upper slot and at least one second upper slot; a second wafer handling chamber configured to be connected to the pass-through chamber and the at least one reaction chamber, the second wafer handling chamber comprising a second robot, the second robot configured to move wafers between the at least one reaction chamber and the pass-through chamber; and a scheduling unit configured to schedule movements of the plurality of wafers by the first robot and the second robot, wherein the scheduling unit configured to schedule the first robot to move wafers originated from the first loadlock from the at least one intermediate chamber into the at least one first upper slot and to move wafers originated from the second loadlock from the at least one intermediate chamber into the at least one second upper slot and, wherein the scheduling unit further configured to schedule the first robot to move a wafer originated from the first loadlock from the at least one intermediate chamber into one of the at least one second upper slot when all the at least one first upper slot are occupied by wafers and to move the wafer to the at least one first upper slot when it becomes available, and wherein the scheduling unit further configured to schedule the first robot to move a wafer originated from the second loadlock from the at least one intermediate chamber into one of the at least one first upper slot when all the at least one second upper slot are occupied by wafers and to move the wafer to the at least one second upper slot when it becomes available.

In at least one aspect, the number of first upper slots is between 1 and 2 and the number of second upper slots is between 1 and 2.

In at least one aspect, the number of reaction chambers is between 2 and 8.

In at least one aspect, the number of intermediate chambers is between 1 and 4.

In accordance with another embodiment there may be provided, a wafer processing method for a wafer processing apparatus, the method comprising: monitoring vacancy status of at least one first upper slot, at least one second upper slot and at least one intermediate chamber; moving a wafer from first loadlock to an intermediate chamber if the at least one intermediate chamber is available; moving the wafer from the intermediate chamber to a second upper slot if all the at least one first upper slot are occupied by wafers and the at least one second upper slot is available; and moving the wafer from the second upper slot to the at least one first upper slot if the at least one first upper slot is available, wherein the apparatus comprising a first loadlock and a second loadlock for storing a plurality of wafers and configured to move the wafers to and from the first and second loadlocks, at least one reaction chamber configured to process wafers, at least one intermediate chamber configured to hold wafers, a first wafer handling chamber configured to be connected to the first loadlock and the second loadlock and the at least one intermediate chamber, the first wafer handling chamber comprising a first robot, the first robot configured to move wafers between the first and second loadlocks, at least one intermediate chamber, and pass-through chamber, pass-through chamber configured to be connected to the first wafer handling chamber, the pass-through chamber comprising upper slots for holding wafers from the at least one intermediate chamber, and lower slots for holding wafers from at least one reaction chamber and the lower slots are placed below the upper slots, and the upper slots further comprising at least one first upper slot and at least one second upper slots, a second wafer handling chamber configured to be connected to the pass-through chamber and the at least one reaction chamber, the second wafer handling chamber comprising a second robot, the second robot configured to move wafers between the at least one reaction chamber and the pass-through chamber and a scheduling unit configured to schedule movements of the plurality of wafers by the first robot and the second robot, the scheduling unit further configured to schedule the first robot to move wafers originated from the first loadlock from the at least one intermediate chamber into the at least one first upper slot and to move wafers originated from the second loadlock from the at least one intermediate chamber into the at least one second upper slot.

In accordance with another embodiment there may be provided, a wafer processing method for a wafer processing apparatus, the method comprising: monitoring vacancy status of the at least one first upper slot, the at least one second upper slot and the at least one intermediate chamber; moving a wafer from the second loadlock to an intermediate chamber if the at least one intermediate chamber is available; moving the wafer from the intermediate chamber to a first upper slot if all the at least one second upper slot are occupied by wafers and the at least one first upper slot is available; and moving the wafer from the first upper slot to the at least one second upper if the at least one second upper slot is available, wherein the apparatus comprising a first loadlock and a second loadlock for storing a plurality of wafers and configured to move the wafers to and from the first and second loadlocks, at least one reaction chamber configured to process wafers, at least one intermediate chamber configured to hold wafers, a first wafer handling chamber configured to be connected to the first loadlock and the second loadlock and the at least one intermediate chamber, the first wafer handling chamber comprising a first robot, the first robot configured to move wafers between the first and second loadlocks, at least one intermediate chamber, and pass-through chamber, the pass-through chamber configured to be connected to the first wafer handling chamber, the pass-through chamber comprising upper slots for holding wafers from the at least one intermediate chamber, and lower slots for holding wafers from at least one reaction chamber and the lower slots are placed below the upper slots, and the upper slots further comprising at least one first upper slot and at least one second upper slots, a second wafer handling chamber configured to be connected to the pass-through chamber and the at least one reaction chamber, the second wafer handling chamber comprising a second robot, the second robot configured to move wafers between the at least one reaction chamber and the pass-through chamber and a scheduling unit configured to schedule movements of the plurality of wafers by the first robot and the second robot, the scheduling unit further configured to schedule the first robot to move wafers originated from the first loadlock from the at least one intermediate chamber into the at least one first upper slot and to move wafers originated from the second loadlock from the at least one intermediate chamber into the at least one second upper slot.

In at least one aspect, the angle of the line from the center of the first robot to the center of a pass-through chamber with respect to the line from the center of the first robot to the center of the second robot is different form the angle of the line from the center of the second robot to the center of the pass-through chamber with respect to the line from center of the first robot to the center of the second robot.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

FIG. 4(*b*) illustrates an angle difference that can be shown in the FIG. 4(*a*) when a wafer is placed in a first upper slot according to an embodiment of the present disclosure.

FIG. 4(*c*) illustrates a layout of the pass-through chamber and upper slots and lower slots according to an embodiment of the present disclosure.

FIG. 5(*a*) illustrates a flowchart of the method of a wafer starting from LL1 according to an embodiment of the present disclosure.

FIG. 5(*b*) illustrates a flowchart of the method of a wafer starting from LL2 according to an embodiment of the present disclosure.

DETAILED DESCRIPTION OF EXEMPLARY EMBODIMENTS

Figure 1:
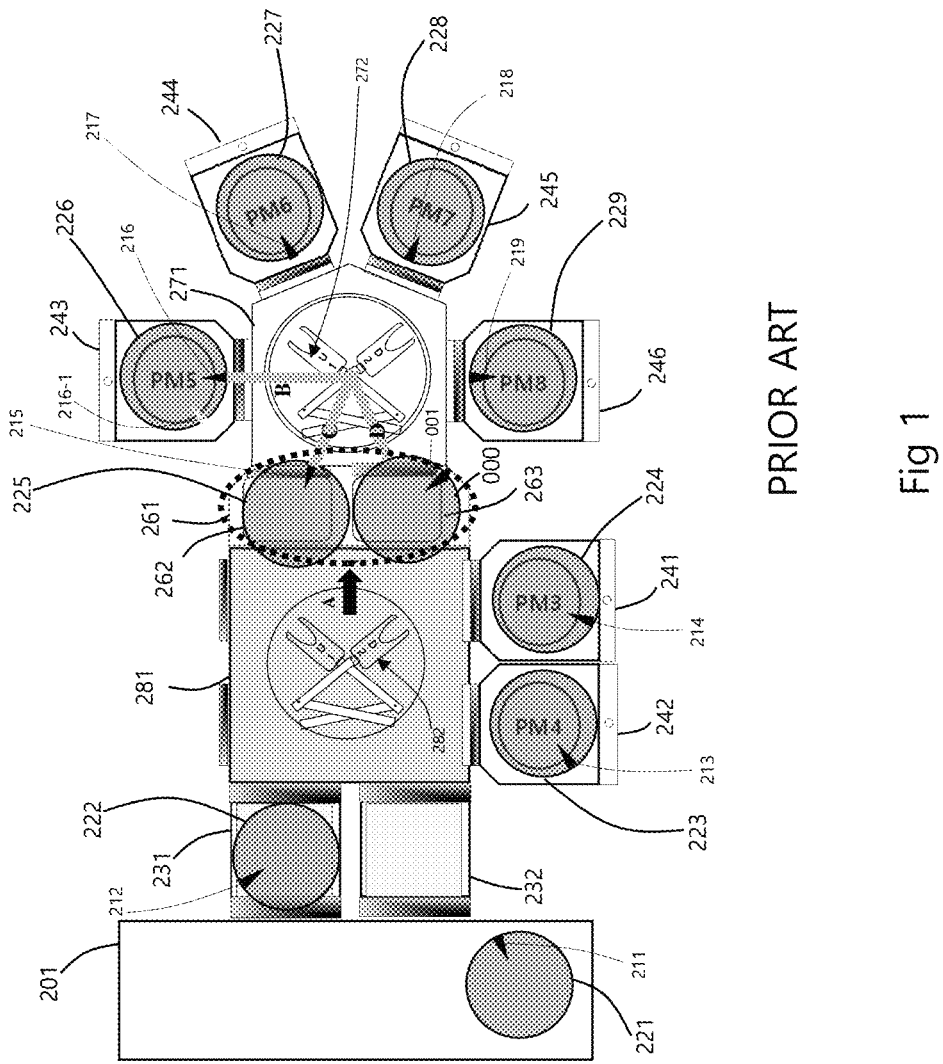
FIG. 1 illustrates a substrate processing apparatus setup view with an example of 4 Process Modules with the first and second robot's position in relative to the chambers in a prior art.
Figure 2:
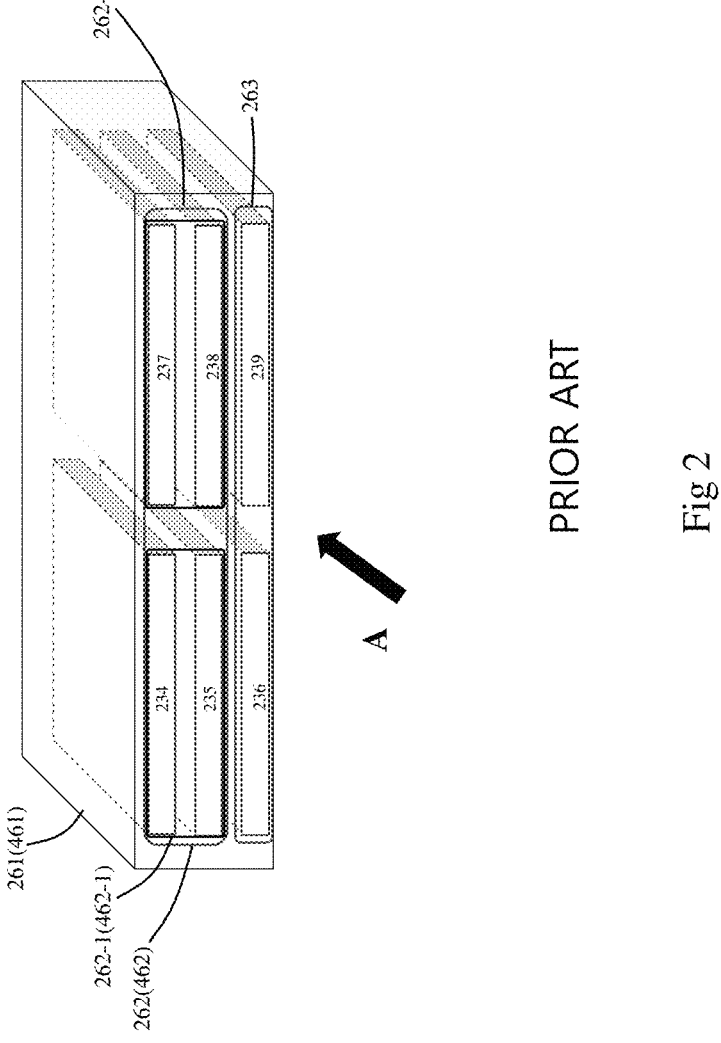
FIG. 2 illustrates the layout of the pass-through chamber, upper slots and lower slots in a prior art.
Figure 3:
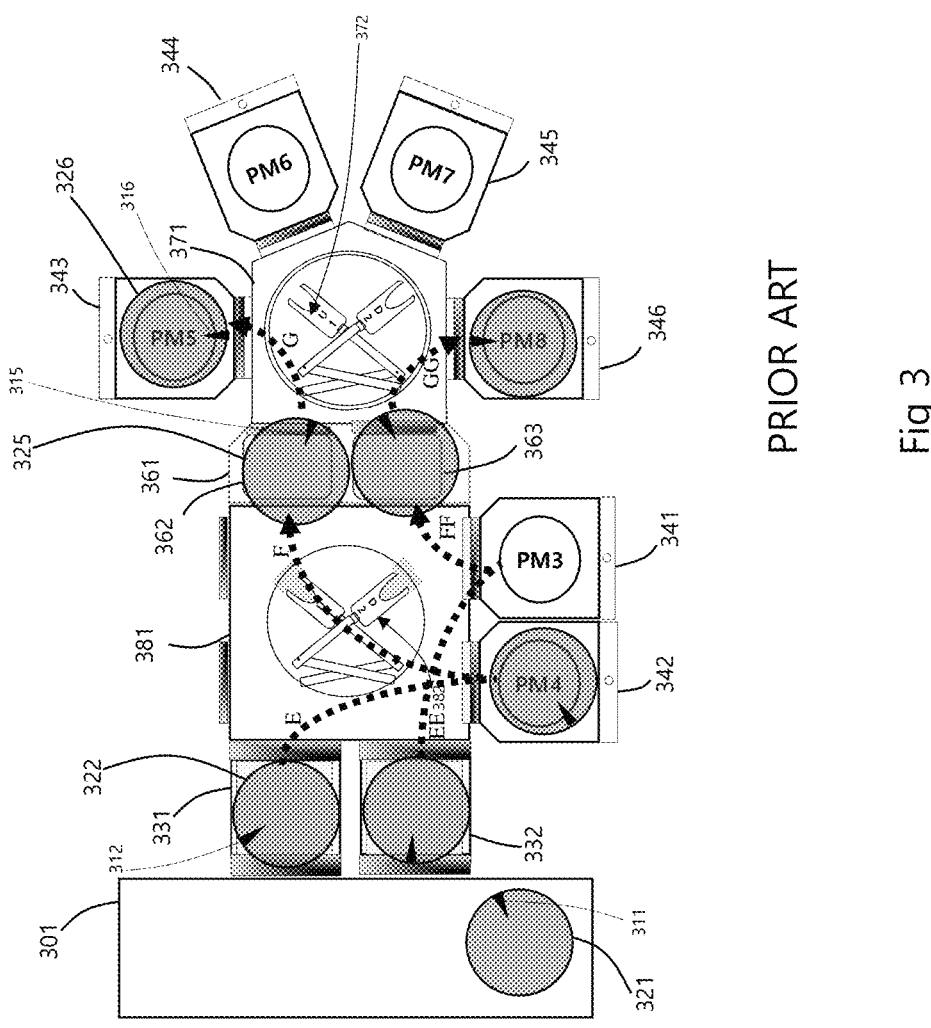
FIG. 3 illustrates a possible path of a wafer from LL1 to a process module in conventional method in a prior art.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

FIG. 4(*a*) illustrates a layout of the present disclosure's apparatus and its exemplary path of a wafer from first loadlock (431) according to the present disclosure.

The processing apparatus may comprise first loadlock (431) and second loadlock (432) for storing wafers for processing. The first and second loadlocks may be configured to store a plurality of wafers and the wafers can be inserted into the first and second loadlocks and the wafers can be removed from the first and second loadlocks. The wafers are to be moved by the first robot 482 in the first wafer handling chamber 481 to one of the intermediate chambers (441, 442) for processing.

The intermediate chambers (441, 442) may be configured to hold and store wafers before wafers head into one of the process modules (PM) for processing or after they are processed and returned from one of the PMs. The number of intermediate chambers can be from 1 to 4 depending on the processing environment. The intermediate chambers can preprocess the wafers before they go to the PMs or cool down and clean the wafers after the wafers are returned from the PMs.

The first wafer handling chamber 481 may be connected to the first and second loadlock (431, 432) and the intermediate chambers (441, 442). The first wafer handling chamber 481 may comprise a first robot 482. The first robot 482 configured to move wafers between the first and second loadlocks (431, 432), the intermediate chambers (441, 442), and pass-through chamber 461.

The pass-through chamber 461 may be configured to be connected to the first wafer handling chamber 481 and second wafer handling chamber 471. The pass-through chamber 461 may comprise upper slots 462 and lower slots 463. The upper slots 462 may be positioned above the lower slots 463. The upper slots 462 may hold wafers coming from one of the intermediate chambers 441, 442. The lower slots 463 may hold wafers coming from one of the reaction chambers 443, 444, 445, 446. The upper slots 462 may comprise first upper slots 462-1 and second upper slots 462-2.

The number of first upper slots 462-1 may be between 1 and 4 and more preferably between 1 and 2. Also the number of the second upper slots 462-2 may be between 1 and 4 and more preferably between 1 and 2. The number of the first upper slots 463-1 and the number of the second upper slots 462-2 may be the same but could also be different according to the processing environment.

The second wafer handling chamber 471 may comprise a second robot 472 and connected to the reaction chambers (443, 444, 445, 446). The second robot 472 may be configured to move wafers between the reaction chambers (PM5 443, PM6 444, PM7 445, PM8 446) and the PTC 461.

The scheduling unit 490 may be configured to schedule movements of wafers by the first robot 482 and the second robot 472 and may be electrically connected to the first wafer handling chamber 481 and the second wafer handling chamber 471.

Figures 4A, 4B, 4C:
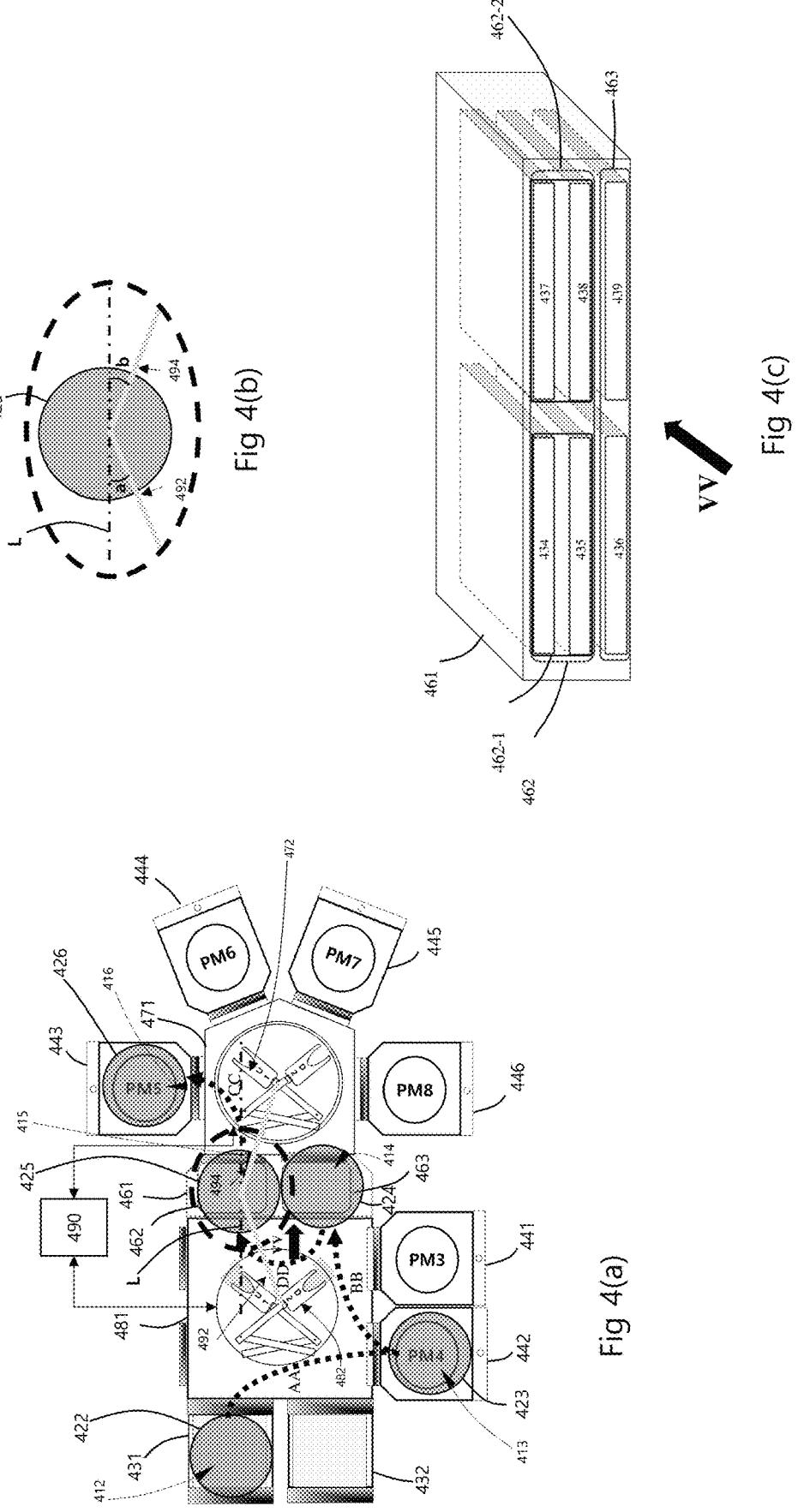
FIG. 4(*a*) illustrates an exemplary path of a wafer from LL1 to a PM (process chamber) according to an embodiment of the present disclosure.

The angle (a) of the line 492 from the center of the first robot 482 to the center of the first upper slots 462-1 with respect to a parallel (L) of a line from the center of the first robot 482 to the second robot 472 may be different from the angle (b) of the line 494 from the center of the second robot 472 to the center of the first upper slots 462-1 (492) with respect to L as shown in FIG. 4(b). And due to this fact, the alignment should be carefully kept.

FIG. 4(c) illustrates the detailed PTC 461 seen from VV direction in the FIG. 4(a).

The scheduling unit 490 may schedule the first robot 482 to move wafers originated from the first loadlock 431 from one of the intermediate chambers 441, 442 into one of the first upper slots 462-1 and to move wafers originated from the second loadlock 432 from one of the intermediate chambers 441, 442 into one of the second upper slots 462-2.

It means that all the wafers from the first loadlock 431 should be scheduled to go to first upper slots 462-1 and all the wafers from the second loadlock 432 should be scheduled to go to second upper slots 462-2. This is because the alignment point of a wafer should be aligned during all the process and it is illustrated in the wafer positions 422, 423, 425, 426 and the respective alignment points 412, 413, 415, 416 in FIG. 4(a).

The scheduling unit 490 may also monitor the vacancy status of the intermediate chambers 441, 442, the first upper slots 462-1 and the second upper units 462-2 (step 510).

If any one of the intermediate chambers 441, 442 is vacant, then a wafer 422 from the first loadlock 431 is moved to that vacant intermediate chamber by the first robot 482 (step 511). Let's suppose that the wafer is in PM4 (wafer 423). When all the first upper slots are occupied but any one of the second upper slots is vacant, then the wafer 423 from the PM4 442 is moved to the vacant second upper slot (suppose the wafer 424 is in slot 437) instead of waiting in the PM4 442 (step 512). This can raise the utility level of the intermediate chambers 441, 442 and the PTCs 461. (less vacant time and less waiting)

After a while, when any one of the first upper slots is vacant, then the wafer 424 in the slot 437 is moved to one of the vacant first upper slots (suppose the wafer 425 is in slot 434) (step 513).

The wafer in one of the first upper slots is moved to one of the vacant reaction chambers by the second robot 472.

Since the number of EPI processing reaction chambers (PM5~ PM8) are usually larger than that of the intermediate chambers (PM3~ PM4) and the EPI processing recipe time is relatively short, a wafer may not stay long enough time in an intermediate chamber. In addition to this, the alignment of the wafers also restricts the usability of the chambers and lowers the productivity of the apparatus in all.

By moving a wafer from the first loadlock 431 to an intermediate chamber (AA), move the wafer to a second upper slot (BB), move the wafer to a first upper slot (DD) by the first robot 482, the PTC usability and wafer productivity may be quite raised.

For wafers from the second loadlock 432, the same method is also applied.

The scheduling unit 490 may monitor the vacancy status of the intermediate chambers 441, 442, the first upper slots 462-1 and the second upper units 462-2 (step 520).

If any one of the intermediate chambers 441, 442 is vacant, then a wafer from the second loadlock 432 is moved to that vacant intermediate chamber by the first robot 482 (step 521). Let's suppose that the wafer is in PM4 (wafer 423). When all the second upper slots are occupied but any one of the first upper slots is vacant, then the wafer 423 from the PM4 442 is moved to the vacant first upper slot (suppose the wafer 425 is in slot 434) instead of waiting in the PM4 442 (step 522). This can raise the utility level of the intermediate chambers 441, 442 and the PTCs 461 (less vacant time and less waiting).

After a while, when any one of the second upper slots is vacant, then the wafer 425 in the slot 434 is moved to one of the vacant second upper slots (step 523).

The wafer in one of the second upper slots is moved to one of the vacant reaction chambers by the second robot 472.

For better productivity and other reasons, the number of the reaction chambers may be between 2 and 8 and it can vary to maximize the efficiency of the apparatus.

It should be noted that the alignment point 414 of the wafer 424 is not facing the center of the second robot 472 because the wafer 424 is originated from first loadlock 431 and if the second robot 472 moves the wafer into one the reaction chambers (suppose PM5), the alignment point 414 would not be aligned with the PMS's wafers' alignment point 416.

The above-described arrangements of apparatus are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

The invention claimed is:

1. A wafer processing apparatus, comprising: a first loadlock and a second loadlock, the first and second loadlocks being configured to store a plurality of wafers and the wafers can be inserted into the first and second loadlocks and the wafers can be removed from the first and second loadlocks; at least one reaction chamber configured to process wafers; at least one intermediate chamber configured to hold wafers; a first wafer handling chamber configured to be connected to the first loadlock and the second loadlock and the at least one intermediate chamber, the first wafer handling chamber comprising a first robot, the first robot configured to move wafers between the first and second loadlocks, the at least one intermediate chamber, and a pass-through chamber; the pass-through chamber configured to be connected to the first wafer handling chamber, the pass-through chamber comprising upper slots for holding wafers from the at least one intermediate chamber, and lower slots for holding wafers from the at least one reaction chamber and the lower slots are placed below the upper slots, and the upper slots further comprising at least one first upper slot and at least one second upper slot; a second wafer handling chamber configured to be connected to the pass-through chamber and the at least one reaction chamber, the second wafer handling chamber comprising a second robot, the second robot configured to move wafers between the at least one reaction chamber and the pass-through chamber; and a scheduling unit configured to schedule movements of the plurality of wafers by the first robot and the second robot, wherein the scheduling unit is configured to schedule the first robot to move wafers originated from the first loadlock from the at least one intermediate chamber into the at least one first upper slot and to move wafers originated from the second loadlock from the at least one intermediate chamber into the at least one second upper slot, wherein the scheduling unit is further configured to schedule the first robot to move a wafer originated from the first loadlock from the at least one intermediate chamber into one of the at least one second upper slot when all the at least one first upper slot are occupied by wafers and to move the wafer to the at least one first upper slot when it becomes available, and wherein the scheduling unit is further configured to schedule the first robot to move a wafer originated from the second loadlock from the at least one intermediate chamber into one of the at least one first upper slot when all the at least one second upper slot are occupied by wafers and to move the wafer to the at least one second upper slot when it becomes available.

2. The apparatus according to claim 1, wherein the number of first upper slots is between 1 and 2 and the number of second upper slots is between 1 and 2.

3. The apparatus according to claim 1, wherein the number of reaction chambers is between 2 and 8.

4. The apparatus according to claim 1, wherein the number of intermediate chambers is between 1 and 4.

5. The apparatus according to claim 1, wherein the at least one first upper slot comprises first upper slots, and wherein an angle of a line from the center of the first robot to the center of a first upper slots with respect to a parallel line of a line from the center of the first robot to the center of the second robot is different form the angle of a line from the center of the second robot to the center of the first upper slots with respect to the parallel line.

6. A wafer processing method for a wafer processing apparatus, the method comprising: monitoring vacancy status of at least one first upper slot, at least one second upper slot and at least one intermediate chamber; moving a wafer from a first loadlock to an intermediate chamber of the at least one intermediate chamber if the at least one intermediate chamber is available; moving the wafer from the intermediate chamber to a second upper slot of the at least one second upper slot if all the at least one first upper slot are occupied by wafers and the second upper slot is available; and moving the wafer from the second upper slot to the at least one first upper slot if the at least one first upper slot is available, wherein an apparatus comprises the first loadlock and a second loadlock for storing a plurality of wafers and configured to move the wafers to and from the first and second loadlocks, at least one reaction chamber configured to process wafers, the at least one intermediate chamber configured to hold wafers, a first wafer handling chamber configured to be connected to the first loadlock and the second loadlock and the at least one intermediate chamber, the first wafer handling chamber comprising a first robot, the first robot configured to move wafers between the first and second loadlocks, the at least one intermediate chamber, and a pass-through chamber, the pass-through chamber configured to be connected to the first wafer handling chamber, the pass-through chamber comprising upper slots for holding wafers from the at least one intermediate chamber, and lower slots for holding wafers from at least one reaction chamber and the lower slots are placed below the upper slots, and the upper slots further comprising the at least one first upper slot and the at least one second upper slot, a second wafer handling chamber configured to be connected to the pass-through chamber and the at least one reaction chamber, the second wafer handling chamber comprising a second robot, the second robot configured to move wafers between the at least one reaction chamber and the pass-through chamber and a scheduling unit configured to schedule movements of the plurality of wafers by the first robot and the second robot, the scheduling unit further configured to schedule the first robot to move wafers originated from the first loadlock from the at least one intermediate chamber into the at least one first upper slot and to move wafers originated from the second loadlock from the at least one intermediate chamber into the at least one second upper slot.

* * * * *